United States Patent [19]

Lindenfelser

[11] Patent Number: 4,868,425

[45] Date of Patent: Sep. 19, 1989

[54] SKEW COMPENSATED RS422 BUFFER

[75] Inventor: Timothy M. Lindenfelser, Eagan, Minn.

[73] Assignee: VTC Incorporated, Bloomington, Minn.

[21] Appl. No.: 129,720

[22] Filed: Dec. 7, 1987

[51] Int. Cl.[4] .................... H03K 19/092; H03K 5/01
[52] U.S. Cl. .................................. 307/475; 307/270; 307/443; 307/268; 307/601
[58] Field of Search ............... 307/475, 270, 268, 443, 307/601

[56] References Cited

U.S. PATENT DOCUMENTS

| 3,962,589 | 6/1976 | Priel et al. | 307/475 |
| 4,164,842 | 8/1979 | Ebihara | 307/270 |
| 4,507,576 | 3/1985 | McCracken et al. | 307/475 |
| 4,511,846 | 4/1985 | Nagy et al. | 307/268 |

Primary Examiner—Stanley D. Miller
Assistant Examiner—Richard Roseen
Attorney, Agent, or Firm—Kinney & Lange

[57] ABSTRACT

A skew compensated RS422 buffer includes a skew compensation circuit and an output driver. The output driver is connected to receive a complementary pair of compensated drive signals, and provides complementary buffer output signals in response thereto. Due to asymmetric switching characteristics, buffer output signals in response to falling edge drive signals are delayed by an inherent skew period with respect to buffer output signals in response to rising edge drive signals. The skew compensation circuit includes a NOR gate and an AND gate, both of which have a first input terminal connected to receive buffer input signals. The buffer input signals are also applied to second input terminals of both the NOR gate and AND gate through delay gates which delay signal propagation by delay periods substantially equal to the inherent skew period of the output driver. A complementary pair of compensated drive signals are provided at output terminals of the NOR and AND gates, thereby compensating for the asymmetric switching characteristics of the output driver means.

10 Claims, 3 Drawing Sheets

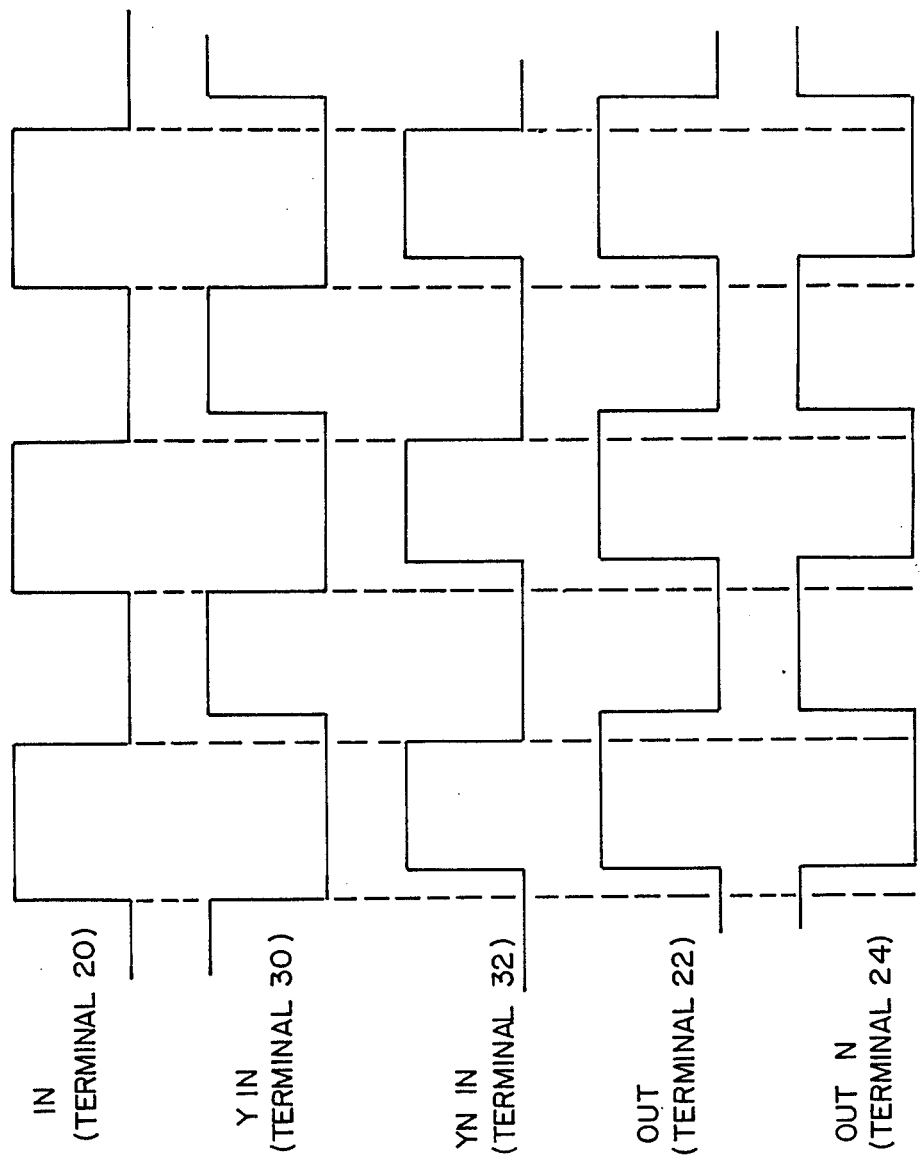

SKEW COMPENSATED RS422 BUFFER

BACKGROUND OF THE INVENTION

1. Field of the Invention.

The present invention relates generally to buffer circuits. In particular, the present invention is a skew compensated RS422 buffer.

2. Description of the Prior Art.

RS422 buffers are commonly used to interface data communication devices to long transmission lines over which data must be transmitted at high rates. A typical RS422 buffer includes two TTL output buffers which are driven or switched one hundred and eighty degrees out of phase with each other to provide complementary output signals. The time skew between positive or rising (i.e. zero-to-one) transistions and negative or falling (i.e. one-to-zero) transitions is a crictical parameter. In general, the lower or smaller the skew, the higher the rate at which data can be accurately transmitted and received.

Asymmetric switching characteristics of the output driver stage of RS422 buffers contribute to overall skew. The inherent difference in the storage time and turn-on time of NPN transistors, for example, results in negative switching transitions which are delayed by a greater amount and thereby skewed from positive switching transitions. Known techniques for minimizing this skew involve using discrete components to control the RC time constant of the switching transistor base drive circuits. Skews can be reduced to three to six nanoseconds using these techniques.

It is evident that there is a continuing need for improved RS422 buffers having reduced skew between rising and falling edges of the complementary output signals. Skews of less than one nanosecond would enable more accurate data communications at higher data rates.

SUMMARY OF THE INVENTION

The present invention is a skew compensated buffer for providing complementary skew compensated buffer output signals in response to buffer input signals. The buffer includes output driver means characterized by asymmetric switching characteristics, and skew compensation means. The output driver means receives complementary compensated drive signals, and provides the complementary buffer output signals in response thereto. Buffer output signals in response to compensated drive signals of a first transition are delayed by an inherent skew period with respect to buffer output signals in response to compensated drive signals of a second transition. The skew compensation means receives the buffer input signals, and provides the complementary compensated drive signals in response thereto. The skew compensation means include means for delaying compensated drive signals of a second transition in response to switching of the buffer input signals by a delay period substantially equal to the inherent skew period, to compensate for the asymmetric switching characteristics of the output driver means.

In a preferred embodiment, the skew compensation means of the buffer includes NOR gate means, AND gate means, first delay gate means and second delay gate means. The NOR gate means has a first input terminal connected to receive the buffer input signals, a second input terminal and an output terminal. The AND gate means has a first input terminal connected to receive the buffer input signals, a second input terminal and an output terminal. The first delay gate means delays buffer input signals coupled to the second input terminal of the NOR gate means by the delay period. A first of the compensated drive signals is provided by the NOR gate means as a logical NOR function of the signals received at its first and second input terminals. The second delay gate means delays the buffer input signals coupled to the second input terminal of the AND gate means by the delay period. A second of the compensated drive signals is provided by the AND gate means as a logical AND function of the signals received at its first and second input terminals. Skews can be reduced to five hundred picoseconds utilizing the buffer of the present invention.

BRIEF DESCRIPTION OF THE DRAWINGS

FIG. 3 is a timing diagram illustrating signals at terminals 20, 22, 24, 30 and 32 to show the operation of the buffer shown in FIG. 1, assuming negligible propagation delays by the level shifters, NOR gate and AND gate for purposes of example.

DETAILED DESCRIPTION OF THE PREFERRED EMBODIMENTS

Figure 1:
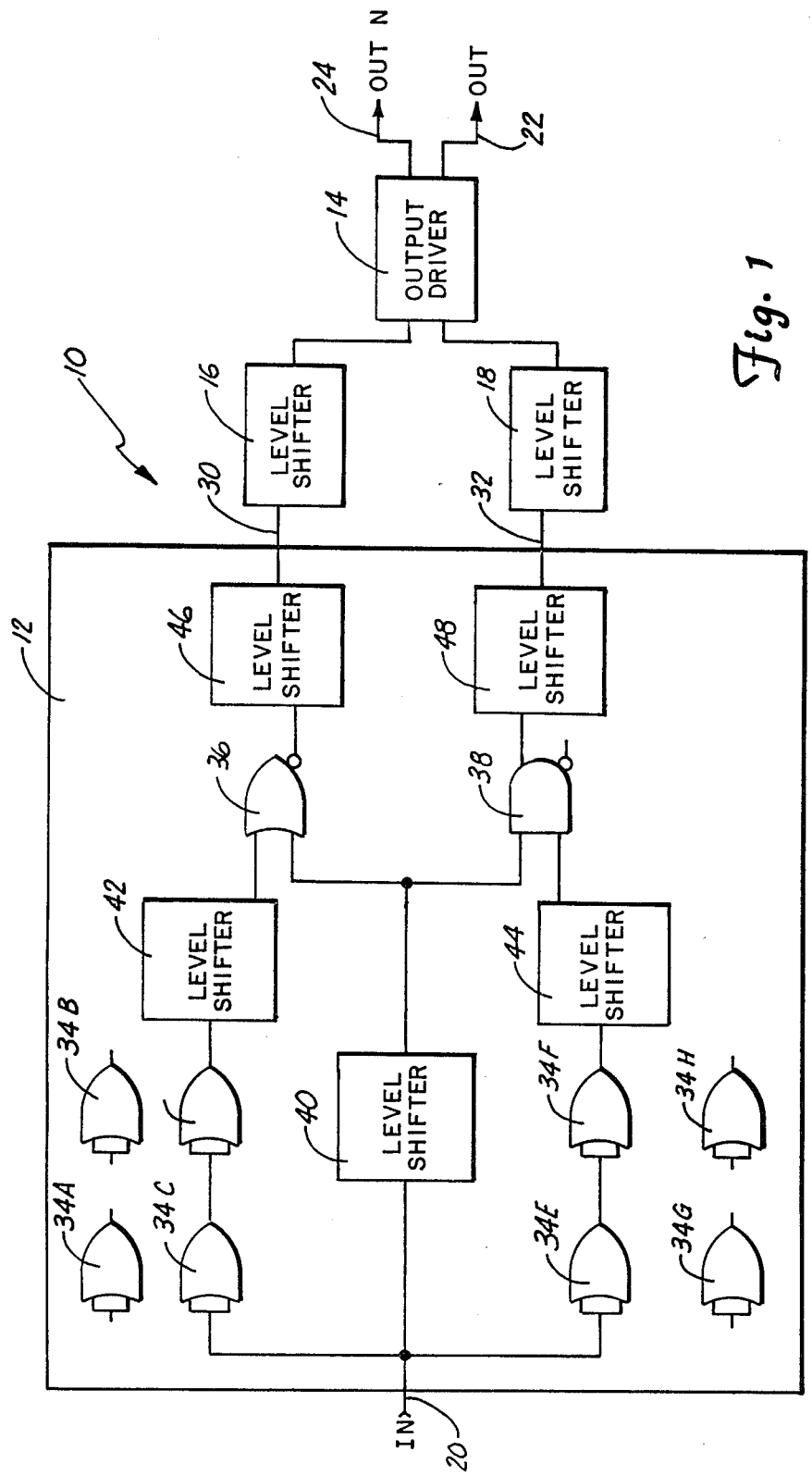
FIG. 1 is a schematic representation of a delay compensated RS422 buffer in accordance with the present invention.

A delay compensated RS422 buffer 10 in accordance with the present invention is illustrated generally in FIG. 1. Buffer 10 includes current mode logic (CML) delay or skew compensation circuit 12, transistor-transistor logic (TTL) output driver 14, and CML-to-TTL level shifters 16 and 18. Buffer 10 receives digital buffer input signals IN at terminal 20, and provides a complementary pair of digital buffer output signals OUT and OUTN at output terminals 22 and 24, respectively. Skew compensation circuitry 12 minimizes skews between signals OUT and OUTN by compensating for asymmetric switching charactersitics inherent in output driver 14.

Figure 2:
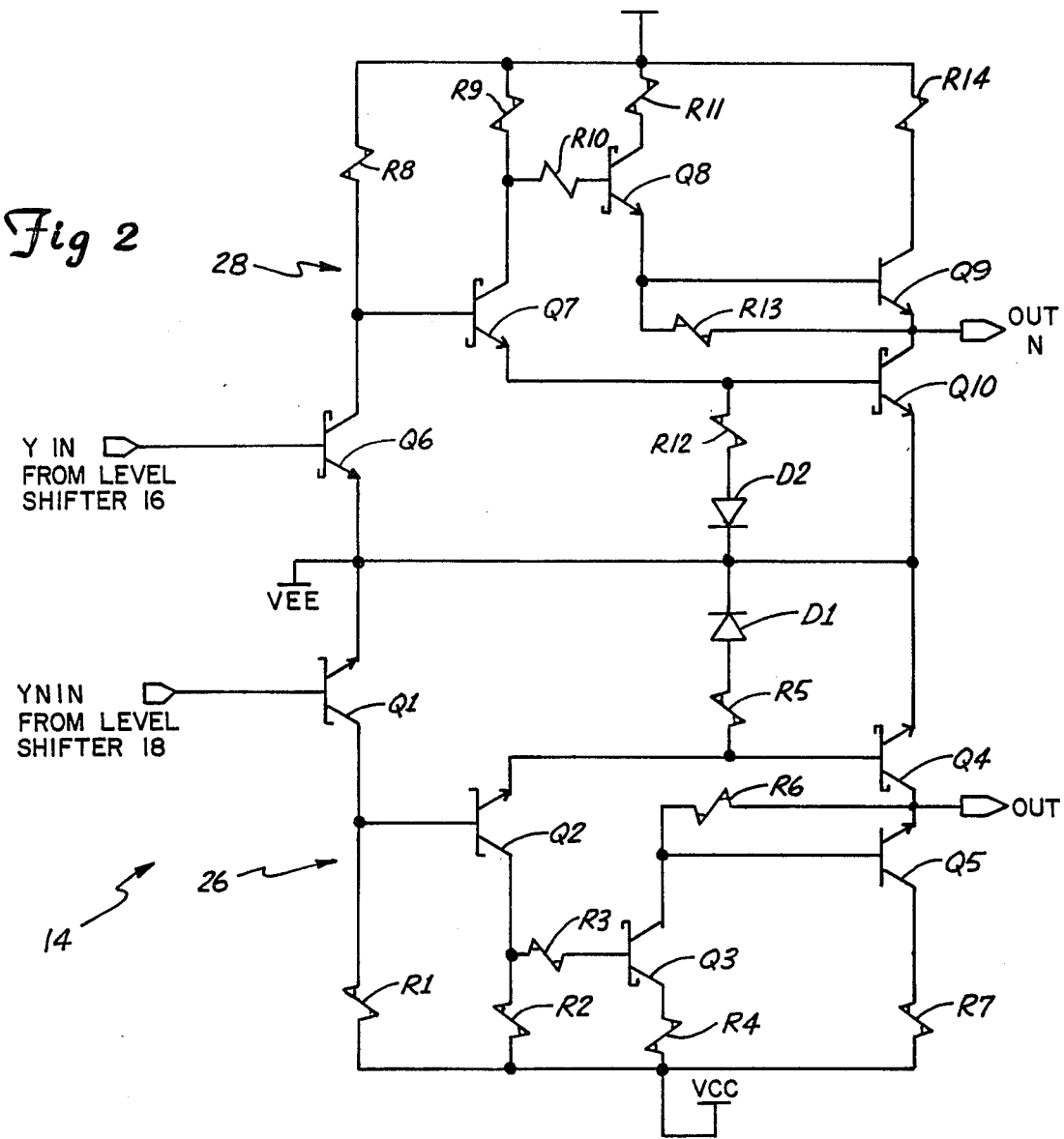
FIG. 2 is a detailed schematic diagram of the output driver shown in FIG. 1.

FIG. 2 is a schematic diagram of a conventional and known TTL output driver 14 which can be used in conjunction with RS422 buffer 10. In the embodiment shown, output driver 14 is formed by two symmetric driver stages 26 and 28 which are switched one hundred and eighty degrees out of phase with one another. Driver stages 26 and 28 are both connected to receive a relatively positive supply potential VCC and a relatively negative supply potential VEE. Driver stage 26 is formed by transistors Q1–Q5, resistors R1–R7 and diode D1. Driver stage 28 is symmetrical to that of stage 26, and is formed by transistors Q6–Q10, resistors R8–R14 and diode D2. Digital level shifted and compensated drive signals YNIN from level shifter 18 are received at the base of transistor Q6, while complementary signals YIN from level shifter 16 are received at the base of transistor Q1. In response to signals YNIN and YIN, driver stages 26 and 28 produce signals OUT and OUTN, respectively, having RS422 electrical characteristics.

The time response of driver stages 26 and 28 to rising edges or positive (i.e. zero-to-one) transitions of signals YN and YNIN differs from that of falling edges or negative (i.e. one-to-zero) transistions. These unequal time responses are due to inherent differences in the storage time and turn-on time of the NPN transistors from which driver stages 26 and 28 are formed. Driver stages 26 and 28 switch faster in response to positive transitions of signals YIN and YNIN than they do to negative transitions. By way of example, if signal YIN is undergoing a positive transition while signal YNIN is simultaneously undergoing a negative transition, signal OUTN will switch from zero to one before signal OUT switches from one to zero. Inherent skews of five hundred to one thousand nanoseconds between positive and negative transistions are common.

Referring back to FIG. 1, delay compensation circuit 12 receives digital buffer input signals IN at terminal 20, and provides complementary digital compensated drive signals at its output terminals 30 and 32. The compensated drive signals provided at terminals 30 and 32 are applied to level shifters 16 and 18, respectively, as shown. In the illustrated embodiment, delay compensation circuit 12 is formed by CML logic elements including a plurality of OR gates such as 34A–34H, NOR gate 36, AND gate 38 and level shifters 40, 42, 44, 46 and 48. Input terminal 20 is coupled to a first intput terminal of both NOR gate 36 and AND gate 38 through level shifter 40. OR gates 34A–34H all have their input terminals coupled together and thereby function as delay elements which delay the propagation of signals applied thereto by predetermined delay periods. In the embodiment shown, terminal 20 is coupled to a second input terminal of NOR gate 36 through a series connection of one or more OR gates such as 34C and 34D, and level shifter 42. Signals from the output terminal of NOR gate 36 are coupled to output terminal 30 of delay compensation circuit 12 through level shifter 46. A second input terminal of AND gate 38 is connected to receive signals from terminal 20 through the series connection of a plurality of OR gates such as 34E and 34F, and level shifter 44. An output terminal of AND gate 38 is connected to output terminal 32 of delay compensation circuit 12 through level shifter 48.

Level shifters 40, 42, and 44 are included to convert the levels of signals provided at terminal 20 and by OR gates 34C, 34D, 34E, 34F to levels required to drive NOR gate 36 and AND gate 38. Signals provided at the output terminals of NOR gate 36 and AND gate 38 are similarly shifted to levels required to drive level shifters 16 and 18 by level shifters 46 and 48, respectively. Level shifters 16 and 18 convert the CML signals received from delay compensation circuit 12 to the TTL levels required to drive output driver 14. Level shifters 16, 18, 40, 42, 44, 46 and 48 have similar and relatively low delays, generally under one hundred picoseconds. Since there is an identical number of level shifters in each signal path (i.e. three), their contribution to the skew between output signals OUTN and OUT is negligable. NOR gate 36 and AND gate 38 also have similar delays. Since one of gates 36 and 38 is in each signal path, their contribution to the skew between signals OUT and OUTN is also negligable.

To compensate for the inherent switching delay between positive and negative transistions of output driver 14, circuit elements such as OR gates 34C, 34D and 34E, 34F are coupled between terminal 20 and the second input terminals of gates 36 and 38. Positive transitions of the signals produced at terminal 30 will therefore be delayed with respect to corresponding negative transitions of the complementary signal produced at terminal 32. The amount or duration of the delay period is determined by the propagation delay of gates such as 34C and 34D coupled between terminal 20 and NOR gate 36. Similarly, positive transitions of signals produced at terminal 32 will be delayed with respect to corresponding negative transitions of the complementary signals produced at terminal 30. The amount of the delay period is determined by the propagation delay of gates such as 34E and 34F coupled between terminal 20 and AND gate 38. Gates 34C, 34D and 34E, 34F are selected so the amount of delay they impose will be equal to, and will thereby compensate for, skews introduced by output driver 14. In essence, delay compensation circuit 12 compensates for the inherent skews of output driver 14 by "pre-delaying" positive transitions of the signals before they are applied to output driver 14. The net result is that corresponding positive and negative transitions of output signals OUT and OUTN will be synchronized with one another.

OR gates 34A–34H can be fabricated so as to have repeatable gate delays of between three hundred fifty and five hundred picoseconds. Although only two gates are shown coupled between terminal 20 and both NOR gate 36 and AND gate 38, the number of gates which is required will of course depend upon their delay, and the inherent switching delays of output driver 14. Assuming, for example, that negative transitions are propagated through output driver 14 four nanoseconds (four thousand picoseconds) slower than positive transitions, and OR gates 34A–34H each impose a 500 picosecond delay, eight gates such as 34A would have to be connected in series between terminal 20 and NOR gate 36. Similarly, eight gates such as 34E would have to be connected in series between input terminal 20 and AND gate 38. Using the above described techniques, it has been found possible to reduce skews between output signals OUT and OUTN of buffer 10 to five hundred picoseconds.

Although the present invention has been described with reference to preferred embodiments, workers skilled in the art will recognize that changes may be made in form and detail without departing from the spirit and scope of the invention.

What is claimed is:

1. A skew compensated buffer for providing complementary skew compensated buffer output signals in response to buffer input signals, including:
   output driver means for receiving complementary compensated drive signals and providing complementary buffer output signals in response thereto, the output driver means characterized by asymmetric switching characteristics whereby buffer output signals in response to drive signals of a first transition are delayed by an inherent skew period with respect to buffer output signals in response to drive signals of a second transition; and
   skew compensation means for receiving buffer input signals and providing the complementary compensated drive signals in response thereto, the skew compensation means including unclocked means for delaying drive signals of a second transition in response to switching of the buffer input signals by a delay period substantially equal to the inherent skew period, to produce the compensated drive signals and compensate for the asymmetric switching characteristics of the output driver means.

2. The skew compensated buffer of claim 1 wherein the skew compensation means includes:

NOR gate means having a first input terminal connected to receive the buffer input signals, a second input terminal and an output terminal, for providing a first of the complementary compensated drive signals as a logical NOR function of the signals received at its first and second input terminals;

AND gate means having a first input terminal connected to receive the buffer input signals, a second input terminal and an output terminal, for providing a second of the complementary compensated drive signals as a logical AND function of the signals received at its first and second input terminals;

first delay gate means for propagating the buffer input signals to the second input terminal of the NOR gate means, and for delaying signals propagated to the second input terminal of the NOR gate means by a delay period substantially equal to the inherent skew period of the output driver means; and second delay gate means for propagating the buffer input signals to the second input terminal of the AND gate means, and for delaying signals propagated to the second input terminal of the AND gate means by a delay period substantially equal to the inherent skew period of the output driver means.

3. The skew compensated buffer of claim 2 wherein:
the first delay gate means includes one or more OR gates connected in series with the second input terminal of the AND gate means; and
the second delay gate means includes one or more OR gates connected in series with the second input terminal of the AND gate means.

4. The skew compensated buffer of claim 2 wherein the skew compensation means further includes:
first level shifter means coupled between the first delay gate means and the second input terminal of the NOR gate means, for level shifting the signals applied to the second input terminal of the NOR gate means from the first delay gate means;
second level shifter means for level shifting the buffer input signals propagates to the first terminals of the NOR gate means and the AND gate means; and
third level shifter means coupled between the second delay gate means and the AND gate means, for level shifting the signals coupled to the second input terminal of the AND gate means from the second delay gate means.

5. The skew compensated buffer of claim 1 and further including a pair of level shifter means coupled between the skew compensation means and the output driver means for level shifting the complementary compensated drive signals coupled to the output driver means.

6. The skew compensated buffer of claim 5 wherein:
the skew compensation means is fabricated of CML logic;
the output driver means is fabricated of TTL logic; and
the level shifter means includes CML-to-TTL level shifters.

7. A skew compensated interface buffer for providing complementary skew compensated buffer output signals in response to buffer input signals, including:

output driver means for receiving complementary compensated drive signals and for providing complementary buffer output signals in response thereto, the output driver means characterized by asymmetric switching characteristics whereby buffer output signals in response to drive signals of a first transition are delayed by an inherent skew period with respect to buffer output signals in response to drive signals of a second transition;

NOR gate means having a first input terminal connected to receive the buffer input signals, a second input terminal and an output terminal, for providing a first of the complementary compensated drive signals as a logical NOR function of the signals received at its first and second input terminals;

AND gate means having a first input terminal connected to receive the buffer input signals, a second input terminal and an output terminal, for providing a second of the complementary compensated drive signals as a logical AND function of the signals received at its first and second input terminals;

first unclocked delay gate means for propagating the buffer input signals to the second input terminal of the NOR gate means, and for delaying the signals propagated to the second input terminal of the NOR gate means by a delay period substantially equal to the inherent skew period of the output driver means; and second delay gate means for propagating the buffer input signals to the second input terminal of the AND gate means, and for delaying the signals propagated to the second input terminal of the AND gate means by a delay period substantially equal to the inherent skew period of the output driver means.

8. The skew compensated buffer of claim 7 wherein:
the NOR gate means, AND gate means, first delay gate means and second gate delay means are formed of CML logic;
the output driver means is formed of TTL logic; and
the buffer further includes a pair of CML-to-TTL level shifters coupling the complementary compensated drive signals to the output driver means.

9. The skew compensated buffer of claim 8 and further including:
a first level shifter propagating the buffer input signals to the first input terminals of the AND gate means and the NOR gate means;
a second level shifter coupling the first delay gate means to the second input terminal of the NOR gate means; and
a third level shifter coupling the second delay gate means to the second input terminal of the AND gate means.

10. The skew compensated buffer of claim 9 and further including:
a fourth level shifter coupling the output terminal of the NOR gate means to a first of the CML-to-TTL level shifters; and
a fifth level shifter coupling the output terminal of the AND gate means to a second of the CML-to-TTL level shifters.

* * * * *

UNITED STATES PATENT AND TRADEMARK OFFICE
CERTIFICATE OF CORRECTION

PATENT NO. : 4,868,425
DATED : September 19, 1989
INVENTOR(S) : Timothy M. Lindenfelser It is certified that error appears in the above-identified patent and that said Letters Patent is hereby corrected as shown below:

Column 5, line 42, delete "propagates" and insert --propagated--.

Signed and Sealed this

Twenty-first Day of August, 1990

Attest:

HARRY F. MANBECK, JR.

*Attesting Officer*     *Commissioner of Patents and Trademarks*